(12) United States Patent
Hirata et al.

(10) Patent No.: US 6,649,036 B2
(45) Date of Patent: Nov. 18, 2003

(54) MIRRORTRON SPUTTERING APPARATUS

(75) Inventors: Toyoaki Hirata, 29-13, Minamitsukaguchi-cho 2 chome, Amagasaki-shi, Hyogo (JP); Masahiko Naoe, Tokyo (JP)

(73) Assignee: Toyoaki Hirata, Hyogo (JP)

( * ) Notice: Subject to any disclaimer, the term of this patent is extended or adjusted under 35 U.S.C. 154(b) by 92 days.

(21) Appl. No.: 09/781,102

(22) Filed: Feb. 8, 2001

(65) Prior Publication Data

US 2001/0013470 A1 Aug. 16, 2001

(30) Foreign Application Priority Data

Feb. 10, 2000 (JP) ........................................ 2000-033886

(51) Int. Cl.[7] .............................................. C23C 14/35
(52) U.S. Cl. .......................... 204/298.18; 204/298.07; 204/298.11; 204/298.16; 204/298.17; 204/298.19
(58) Field of Search ..................... 204/192.12, 298.11, 204/298.16, 298.17, 298.18, 298.19, 298.07

(56) References Cited

U.S. PATENT DOCUMENTS

| 4,842,708 | A | * | 6/1989 | Kadokura et al. | ..... 204/298.16 |
| 4,865,708 | A | * | 9/1989 | Welty | ................ 204/192.12 |
| 4,871,434 | A | * | 10/1989 | Munz et al. | ........... 204/192.16 |
| 5,000,834 | A | * | 3/1991 | Yoshikawa | ............. 204/298.08 |
| 6,083,361 | A | * | 7/2000 | Kobayashi et al. | .... 204/298.07 |

* cited by examiner

Primary Examiner—Rodney G. McDonald
(74) Attorney, Agent, or Firm—Perkins Coie LLP

(57) ABSTRACT

A mirrortron sputtering apparatus for sputtering on a substrate includes a vacuum chamber for placing therein a pair of targets spaced apart from each other with inner surfaces thereof facing each other and outer surfaces thereof positioned opposite to the inner surfaces, and magnets respectively disposed closer to the outer surfaces of the targets for forming a magnetic field between said pair of targets. The magnetic field has a magnetic field distribution with a peripheral region having a high magnetic flux density and a center region having a low magnetic flux density. In this arrangement, the substrate is set alongside a space between the pair of targets as facing said magnetic field.

26 Claims, 6 Drawing Sheets

FIG. 4
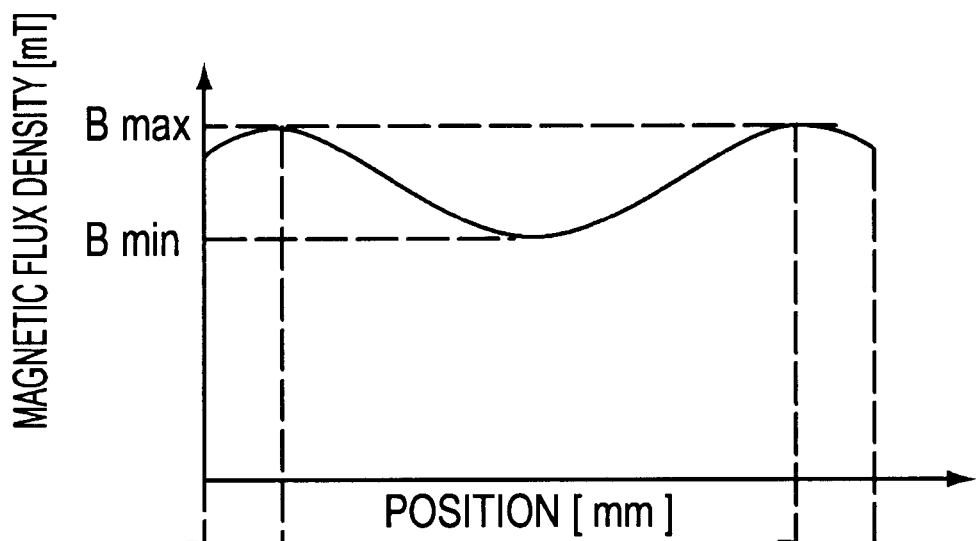
FIG. 5
FIG. 6
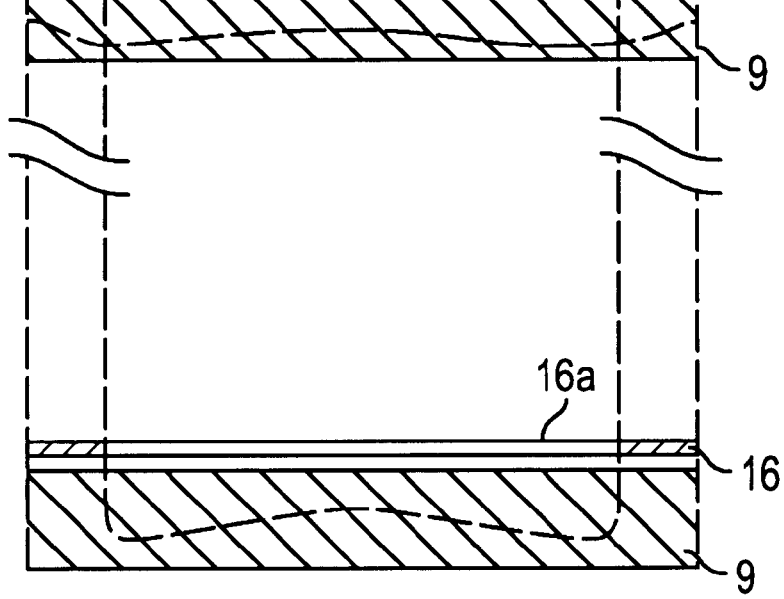

MIRRORTRON SPUTTERING APPARATUS

BACKGROUND OF THE INVENTION

1. Field of the Invention

The present invention relates to a mirrortron sputtering apparatus, and more particularly a mirrortron sputtering apparatus suitable for preparing an oxide thin film which is expected to be applicable for manufacturing a light guide device, a SAW (Surface Acoustic Wave) filter, or any other devices in telecommunication-related fields.

2. Discussion of the Background

Heretofore, a sputtering apparatus of various types such as high-frequency sputtering type, magnetron sputtering type and opposite-target (mirrortron) sputtering type has been proposed for forming a thin film on the surface of a substrate by utilizing the sputtering phenomenon. Among proposed types, the mirrortron sputtering apparatus has recently received much attention as a remarkably effective sputtering apparatus because of its remarkably high-speed thin-film forming performance.

There have been proposed the mirrortron sputtering apparatus of various types, such as those known from Japanese Unexamined Patent Application (Kokai) Nos. Hei-03-247758 and Hei-04-198477. Any one of the cited publications basically has an arrangement as described below.

Specifically, as illustrated in FIG. 8, the conventional mirrortron sputtering apparatus includes a vacuum chamber 40 in which a pair of targets 41 formed of silicon are disposed as opposed to each other with a space therebetween, magnets 42 respectively disposed on the outer sides of the targets for forming a magnetic field H' between the targets 41. A substrate 43 as a workpiece is set alongside of a space between the targets 41 with a surface of the substrate 43 facing the magnetic field H'.

For purposes of the description set forth herein, unless otherwise specified, certain directional terms shall, when used herein, have the meanings set forth below. The term "inner" is relative to the intermediate position between the targets or the position closer to the intermediate position, and "outer" is relative to the position away from the intermediate position. The term "longitudinal" is relative to the direction extending between the targets, and "lateral" is relative to the direction extending orthogonal to the direction extending between the targets.

Gas supplying systems 44 are arranged alongside or on a lateral side of the space between the targets 41 for introducing an inert gas such as argon gas into the magnetic field H', thereby producing a plasma between the targets 41. On the lateral side opposite to the gas supplying systems 44, gas supplying systems 45 are arranged closer to the substrate 43 for introducing a reactive gas such as oxygen gas, thereby causing a reaction with sputtered atoms.

After vacuum pumping the vacuum chamber 40, argon gas is introduced therein, and then a voltage is applied to the targets 41 to dispose cathodes on the targets 41, so that the argon gas present in the targets 41 is ionized and becomes a plasma. A thus formed plasma flow reciprocatingly moves between the targets 41 within a closed space defined by the magnetic field H', thereby sputtering the targets 41.

The silicon atoms sputtered out of the surfaces of the targets fly away from the magnetic field H' to be oxidized by the introduced oxygen gas and then deposited on the surface of the substrate 43. Thus, the oxidized silicon oxide thin film is formed on the surface of the substrate 43.

However, as illustrated in FIG. 9, the magnetic field H' obtained by the conventional mirrortron sputtering apparatus has a magnetic field distribution with a peripheral region having a low magnetic flux density ($B'_{min}$) and a center region having a high magnetic flux density ($B'_{max}$), forming a curved line as illustrated in FIG. 9. Since the plasma density is varied according to the magnetic field distribution to some extent, the targets 41 each are eroded into a concave shape as illustrated in dashed lines in FIG. 10.

The thus eroded targets 41 each having a peripheral portion insufficiently eroded need to be replaced with new ones, resulting in not only causing a poor efficiency in film-forming due to the increased number of times for the replacement of the targets, but also the difficulty in the automatization of the film-forming process. In addition, the total erosion amount per one target 41 is relatively small, so that the targets 41 can not be efficiently consumed, resulting in uneconomical sputtering operation.

The magnetic field H' obtained by the conventional mirrortron sputtering apparatus has a low magnetic flux density in the peripheral portion, so that the reactive gas is likely to intrude into the peripheral region of the magnetic field H'. As a result of such intrusion of the reactive gas, there causes a reaction on the surfaces of the targets 41, which reaction in turn forms on the targets a dielectric film of such as oxide, or nitride, with the result that abnormal arc discharge frequently occurs. This may pose problems of such as decreasing the film-forming speed, or rendering the sputtering inoperable with no formation of the film.

In consideration of the above problems, it is an object of the present invention to provide a mirrortron sputtering apparatus that is capable of smoothly and securely forming films through the increase in the total erosion amount per one target and hence a limited number of times that the targets are replaced with new ones, while maintaining a stabilized sputtering even in a reactive sputtering operation.

SUMMARY OF THE INVENTION

According to the present invention, there is provided a mirrortron sputtering apparatus for sputtering on a substrate that includes a vacuum chamber for placing therein a pair of targets spaced apart from each other with inner surfaces thereof facing each other and outer surfaces thereof positioned opposite to the inner surfaces, and magnets respectively disposed closer to the outer surfaces of the targets for forming a magnetic field between the pair of targets. The magnetic field has a magnetic field distribution with a peripheral region having a high magnetic flux density and a center region having a low magnetic flux density. In this arrangement, the substrate is set alongside a space between the pair of targets with a surface of the substrate facing the magnetic field.

In the mirrortron sputtering apparatus having the above arrangement, with the magnets whose material, shape and formation are suitably determined according to a specific purpose, the magnetic field distribution has a magnetic flux density which is maximized at the peripheral region and is minimized at the center region, forming a caldera-like magnetic field distribution. Hence, the sputtering under this condition causes each target to be eroded into a concave shape with a peripheral portion slightly thinner than a center portion.

As an additional advantage, the peripheral region of the magnetic field, which has a high magnetic flux density, enables the plasma to be securely concealed in the magnetic field, while preventing the reactive gas from easily intruding into the peripheral region. As a result, the occurrence of the abnormal arc discharge can be limited.

The mirrortron sputtering apparatus may further include shield covers for respectively covering the pair of targets. The shield covers each have a peripheral edge forming an opening and extending around the peripheral region of the magnetic field.

With the above arrangement, the sputtering is effected only on the surface area of each target exposed through the opening defined in the corresponding shield cover, so that the residual unexposed surface area is not sputtered. The reason for covering a particular surface area of each target is that it is necessary to limit the occurrence of the abnormal arc discharge in the peripheral region of the space within which the erosion is effected.

In the mirrortron sputtering apparatus having the above arrangement, it is preferable to set the magnetic field distribution so that the peripheral region of the magnetic field has a magnetic flux density of 8 mT to 50 mT at positions intersecting an interface between the pair of targets; and the center region of the magnetic field has a magnetic flux density of 0 mT to 8 mT at a position intersecting the interface between the pair of targets.

BRIEF DESCRIPTION OF THE DRAWINGS

The above, and other objects, features and advantages of the present invention will become apparent from the detailed description thereof in conjunction with the accompanying drawings wherein.

FIG. 4 is a graph representative of a magnetic field distribution of the magnetic field according to the one embodiment.

FIG. 5 is a side view of a target with its position corresponding to FIG. 4.

FIG. 6 is a side view of the target with its position corresponding to FIG. 4 in the arrangement with a shield cover covering a particular surface area of the target.

DETAILED DESCRIPTION OF THE PREFERRED EMBODIMENT

Figure 1:
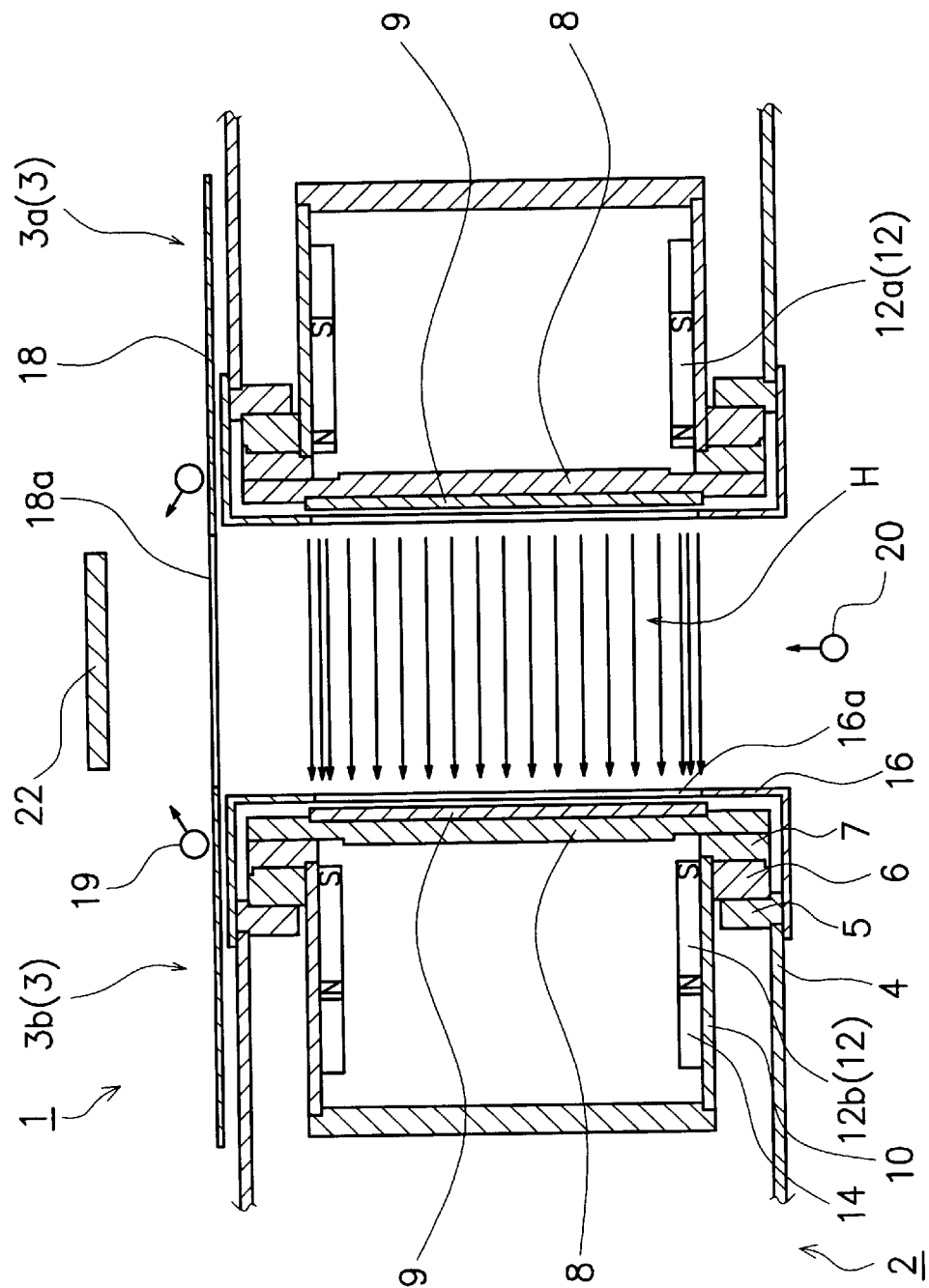
FIG. 1 is a schematic view of a mirrortron sputtering apparatus according to one embodiment of the present invention.

An embodiment of the present invention will be hereinafter described with reference to the drawings attached hereto. The description will be first made for the basic arrangement of the mirrortron sputtering apparatus according to this embodiment with reference to FIG. 1.

The mirrortron sputtering apparatus of this embodiment includes a vacuum chamber 1, in which a pair of plate-shaped targets 9 formed of such as silicon are disposed as facing each other with a space therebetween. The pair of targets 9 are respectively supported by a pair of target holders 3 mounted on a body 2 to be placed in parallel alignment with each other. The pair of target holders 3 each include a first hollow member 4 having a rectangular cross-section and fixed on the body 2, a first flange 5 fixed on an open end of the first hollow member 4, a second flange 6 fixed on the first flange 5, a third flange 7 fixed on the second flange 6, and a square-shaped support plate 8 fixed on the third flange 7.

Inside of each of the first hollow members 4 is provided a second hollow member 10 having a peripheral edge fixed on the inner surfaces of the second flange 6 and the third flange 7, so that the second hollow member 10 is positioned coaxially with the first hollow member 4. The second hollow members 10 respectively have inner surfaces on which first and second groups of magnets 12a, 12b are mounted closer to the outer sides of the respective targets 9 to form a magnetic field H between the targets 9.

Both groups of the magnets 12a, 12b, which are mounted on the respective second hollow members 10, are oriented with their poles of opposed polarity positioned facing each other, so that magnetic lines of force flow from a first target holder 3a towards a second target holder 3b. Specifically, the first group of magnets 12a on the first target holder 3a have N poles respectively facing the second group of magnets 12b on the second target holder 3b, while the second group of magnets 12b on the second target holder 3b have S poles respectively facing the first group of magnets 12a on the first target holder 3a.

Various known magnets such as a ferrite magnet, samarium(Sm)-cobalt(Co) magnet, and iron(Fe)-neodymium(Nd)-boron(B) magnet can be used to form the magnets 12. Among these magnets, the iron(Fe)-neodymium(Nd)-boron(B) magnet is suitable for the magnets 12 since it produce a strong magnetic force with a surface magnetic flux density of about 300 mT to 400 mT.

In each of the target holders 3a, 3b, the outer ends of the respective magnets 12, which are positioned opposite to the inner ends thereof, are respectively joined to rectangular block shaped yokes 14 formed of a magnetic substance such as stainless steel. The yokes 14 function to enable the magnetic lines of force, which return from the inner ends of the magnets 12 or the ends facing the opposite target holder 3, to be drawn back to the outer ends of the yokes 12, which ends are opposite to the ends joined to the magnets 12. As a result, among the magnetic lines of force, those returning from the inner ends of the magnets 12 flow back in a substantially straight line to the outer ends of the yokes 14. In this embodiment, the yokes 14 are fixed respectively on the second hollow members 10, and joined respectively to the outer ends of the magnets 12 via an adhesive applied on the ends to be joined together.

Shield covers 16 are respectively mounted on the inner sides of the target holders 3 in such a manner as to partially cover the surfaces of the corresponding targets 9. In each target holder 3, the shield cover 16 defines an opening 16a open to a predetermined portion of the target 9 so as to expose only a predetermined portion of the target 9 through the opening 16a. The shield cover 16 is formed by, for example a SUS 306 plate member to act as an earth electrical potential (i.e., 0 V).

On a lateral side of the pair of the target holders 3 is provided a plate-shaped partition wall 18 which defines therein an opening 18a open to the space between the targets 9. In this embodiment, the opening 18a is formed into a rectangular shape with a longitudinal side, which extends vertically on the surface of FIG. 1, having a length corresponding to the longitudinal length of each target 9, which extends vertically on the surface of FIG. 1, and with a lateral side, which extends parallel to the surface of FIG. 1, having a length corresponding to the length between the targets 9, thereby substantially matching a transverse section image of the space between the targets or an imaginary plane parallel to the partition wall 18 in size and shape with the opening 18a.

While gas supplying pipes 19 are disposed on the outside of the partition wall 18 and closer to its edge defining the opening 18a to supply a reactive gas such as oxygen gas or nitrogen gas into the space between the targets 9, a gas supplying pipe 20 is disposed on a lateral side opposite to the gas supplying pipes 19 and adjacent to the space between the targets 9 to supply an inert gas such as argon gas into the space between the targets 9.

On the other hand, a substrate 22 is positioned on the outside of the partition wall 18 with a surface of the substrate facing the space (magnetic field H) between the targets 9. The reactive gas passing through the gas supplying pipes 19 is blown against the substrate 22 or blown in an oblique direction with respect to the partition wall 18 through a gas outlet nozzle (not shown) having the diameter of about 0.5 mm to 2 mm.

The flow rate of the reactive gas is controllable so that the compounds of the sputtered particles can have variable compositions. For example, where the material of the target is silicon (Si), x in a silicon oxide of the composition formula SiOx can be varied from 0 to 2.

In order to enhance the activity of the reactive gas, the mirrortron sputtering apparatus of this embodiment may take various measures as follows: a DC voltage or high-frequency voltage (RF) may be applied to each of the gas supplying pipes 19 and the substrate 20 to ionize the reactive gas; the light or the particle beam may be radiated to a space near the surface of the substrate 22 to bring the reactive gas into an excitation state; and a bias voltage is applied to the substrate 22 to ionize the reactive gas (specific arrangements for performing these functions are not illustrated herein).

Now, the description will be made for the magnetic field H, which is a characteristic feature of the present invention, with reference to the drawings.

Figure 2:
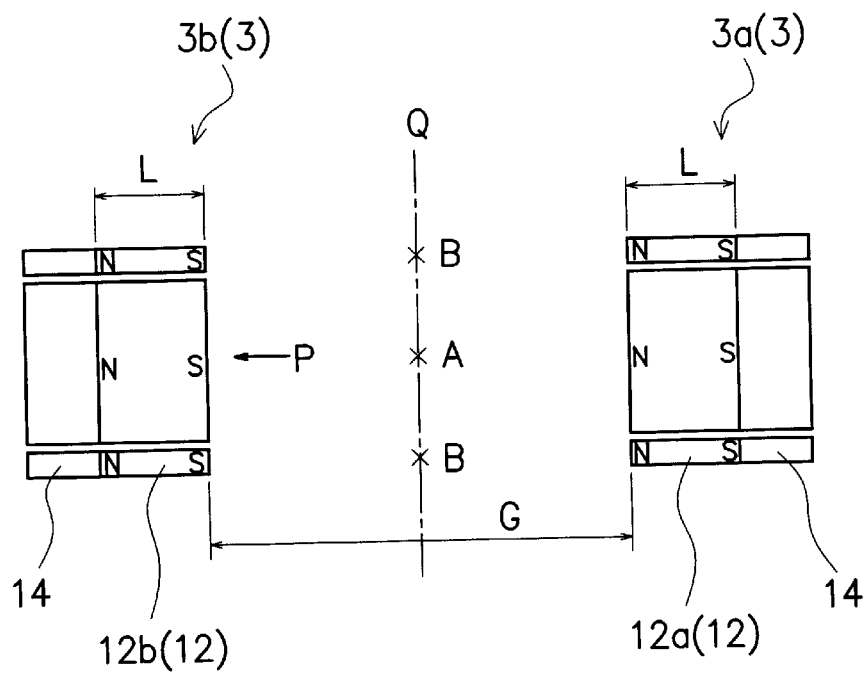
FIG. 2 is a side view of a magnet arrangement according to the one embodiment.
Figure 3:
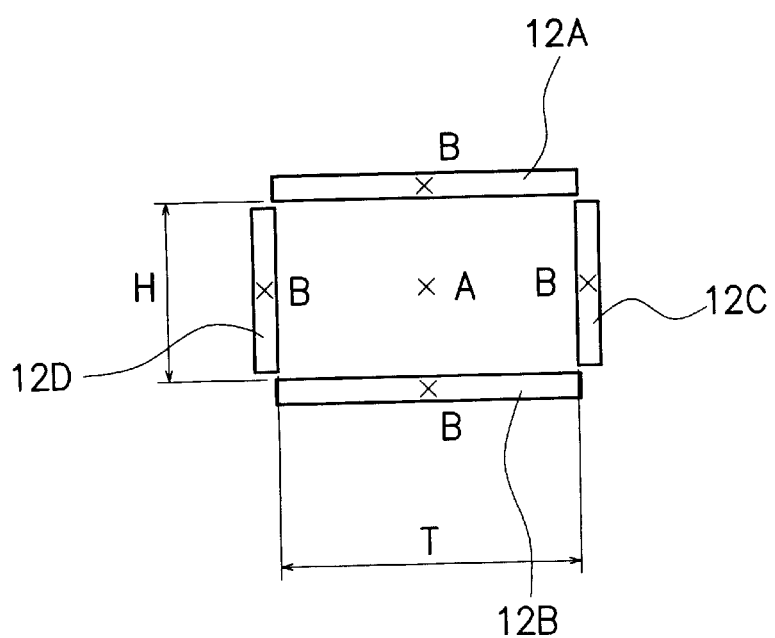
FIG. 3 is the magnet arrangement as viewed in the direction of arrow P in FIG. 2.

FIG. 2 illustrates a specific arrangement of the magnets 12 and the yokes 14. As being apparent from this Figure, a magnetic field generation means in each target holder 3 is formed by four magnets 12 (i.e., first or second group of the magnets 12a, or 12b), which are arranged in a rectangular shape, so that the magnetic field generation means is formed into a rectangular-column shape with a pair of the horizontally extending opposed magnets 12A, 12B having the length longer than a pair of the vertically extending opposed magnets 12C, 12D, forming an oblong rectangle as illustrated in FIG. 3, which is a view as viewed in the direction of arrow P in FIG. 2.

The magnets are arranged in the manner as described below, in which G: the distance between the opposed magnets 12a, 12b, L: the length of the magnets 12, H: the distance between the opposed magnets 12A, 12B, and T: the distance between the opposed magnets 12C, 12D.

The distance G is preferably not less than 150 mm, more preferably in the range between 160 mm and 220 mm, and most preferably not more than 190 mm; the length L has preferably a ratio of not less than 3.6 with respect to the distance G, more preferably in the range between 3.8 and 4.2, and most preferably not more than 4; the distance H is preferably not less than 70 mm, more preferably in the range between 90 mm and 150 mm, and most preferably not more than 120 mm; and the distance T is preferably not less than 120 mm, more preferably in the range between 130 mm and 160 mm, and most preferably not more than 150 mm.

Further, within the above numerical ranges, their values are set so that a center region of the magnetic field H, which includes the center lying on the line Q between the magnets 12a, 12b (i.e., the interface between the targets 9) and its periphery, or a center region which includes an intersection point (Point A in FIGS. 2 and 3), which is an intersection point between the common longitudinal axis of the aligned magnets 12 and the interface Q, and its periphery, has a minimum magnetic flux density, while a peripheral region on the interface Q between the magnets 12a, 12b, or a region, which lies in a slightly inner side than the intersection points (Points B) of the line extending between the magnets 12a, 12b and the interface Q, has a maximum magnetic flux density.

The maximum magnetic flux density ($B_{max}$) is set to a value of not less than 8 mT, preferably in the range between 10 mT and 50 mT, and more preferably in the range between 10 mT and 30 mT, while the minimum magnetic flux ($B_{min}$)) is set to a value of not less than 0 mT, preferably in the range between 2 mT and 8 mT, and more preferably in the range between 2 mT and 5 mT.

As described above, the magnetic field H obtained by the mirrortron sputtering apparatus of this embodiment has a caldera-like magnetic field distribution with the peripheral region having a high magnetic flux density and a center region having a low magnetic flux density, as illustrated in FIG. 4. When viewing this distribution in a three-dimensional manner, the peripheral region having a high magnetic flux density exists in a ring shape, inside of which the center region having a low magnetic flux density exists as if it is surrounded by the peripheral region. Accordingly, the sputtered targets 9 each are eroded into a concave shape with a peripheral portion slightly thinner than a center portion, as illustrated in dashed lines in FIG. 5. As a result, the total erosion amount per one target 9 is increased, thereby decreasing the number of times that the target is replaced with a new one, and hence improving a time efficiency in film-forming.

A peripheral edge region which is a boundary region to the outside of the magnetic field H and is located on the outside of the peripheral region of the magnetic field H tends to have a magnetic flux density slightly lower than the maximum magnetic flux density $B_{max}$. To securely prevent the reactive gas from intruding into the peripheral region of the magnetic field H through a peripheral edge region, the edge of the opening 16a of the shield cover 16 in each target holder 9 extends in such a manner as to conform with the ring-shaped peripheral region having a high magnetic flux density. Accordingly, the abnormal arc discharge hardly occurs in the peripheral region of the erosion effective space. As a result, the sputtering operation can be maintained in a stabilized manner, thereby achieving a smooth and secured film-forming operation.

EXAMPLES

Figure 7:
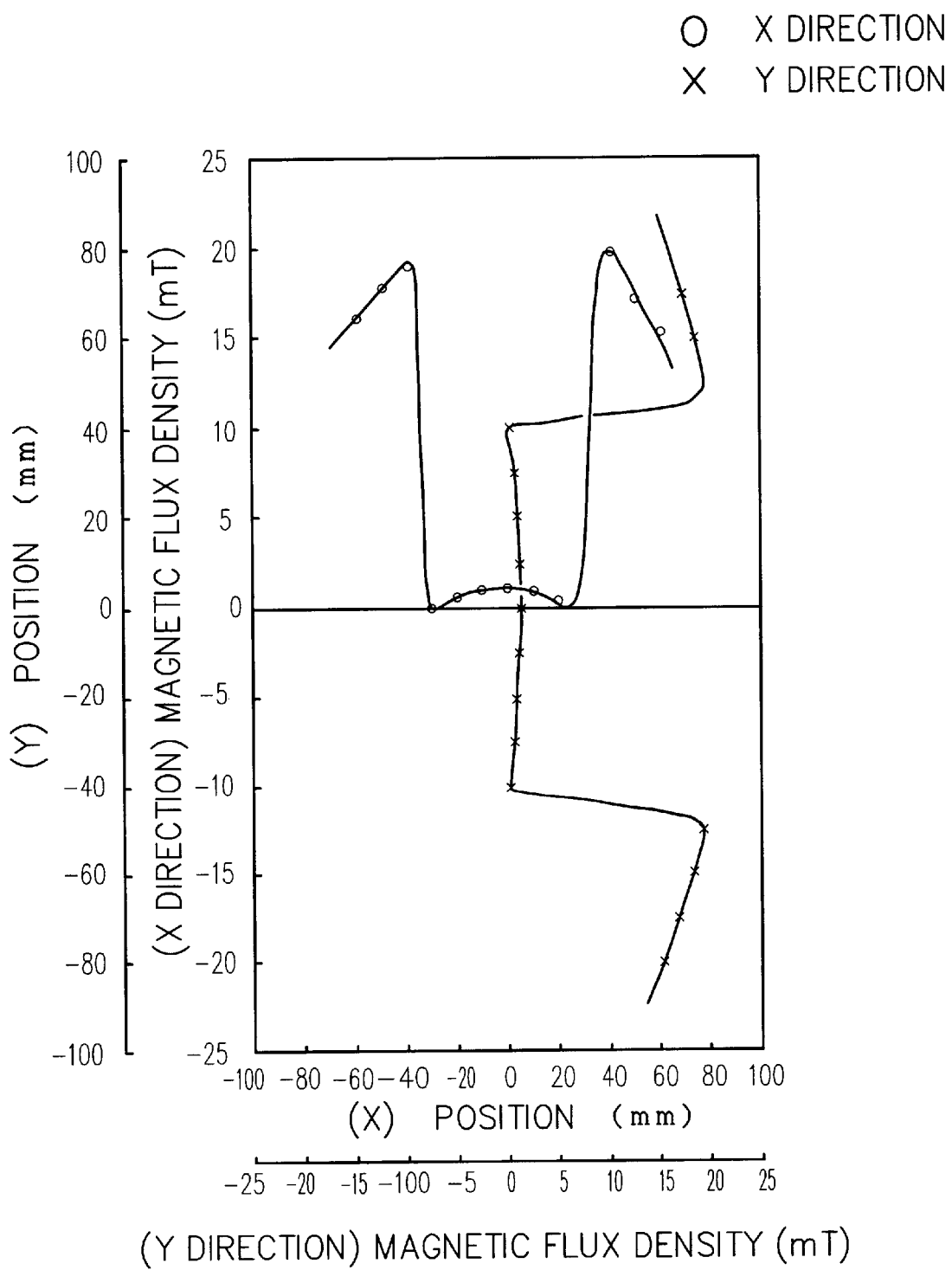
FIG. 7 is a graph representative of the measured result of the magnetic field distribution according to the one embodiment.
Figure 8:
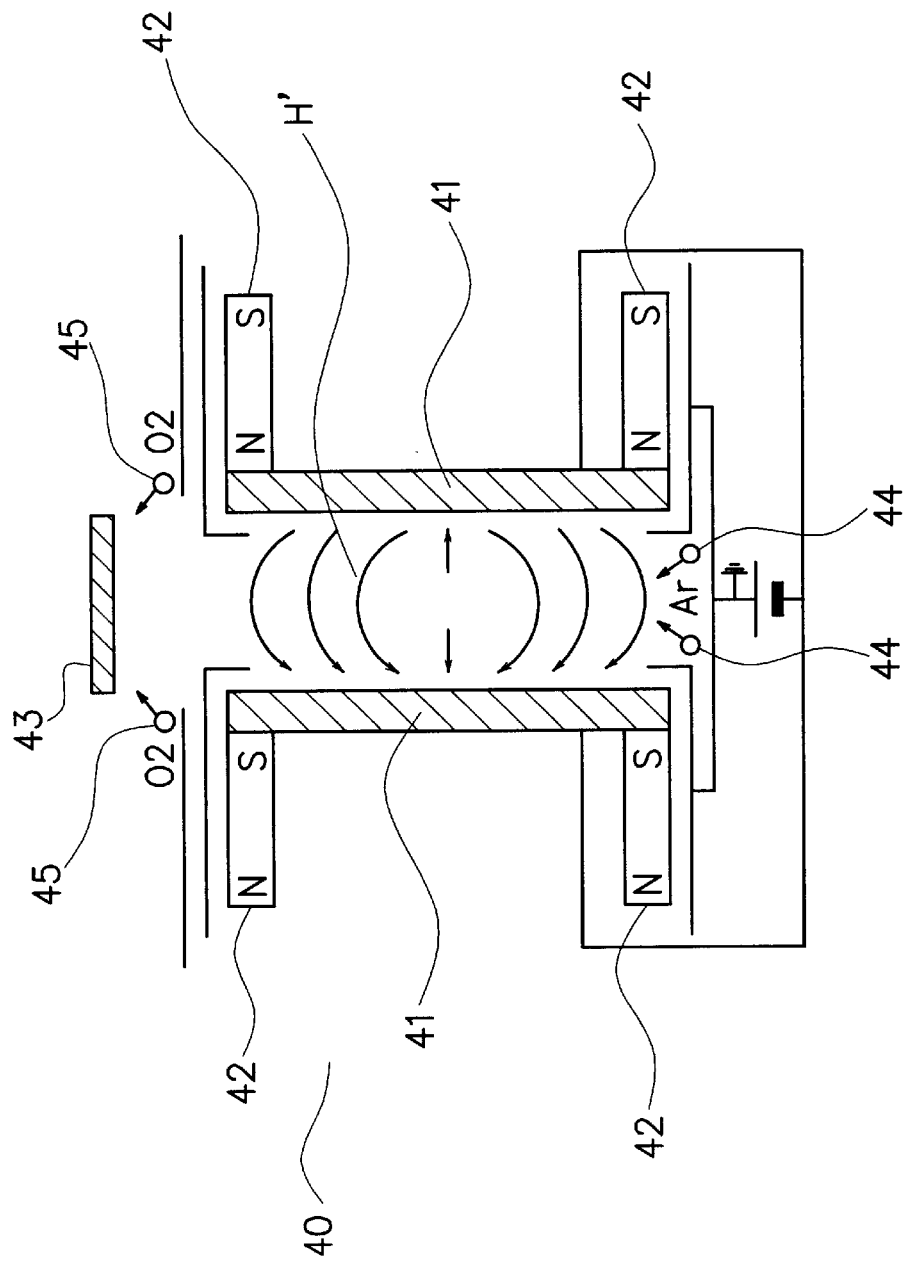
FIG. 8 is a schematic view of the conventional mirrortron sputtering apparatus.
Figures 9, 10:
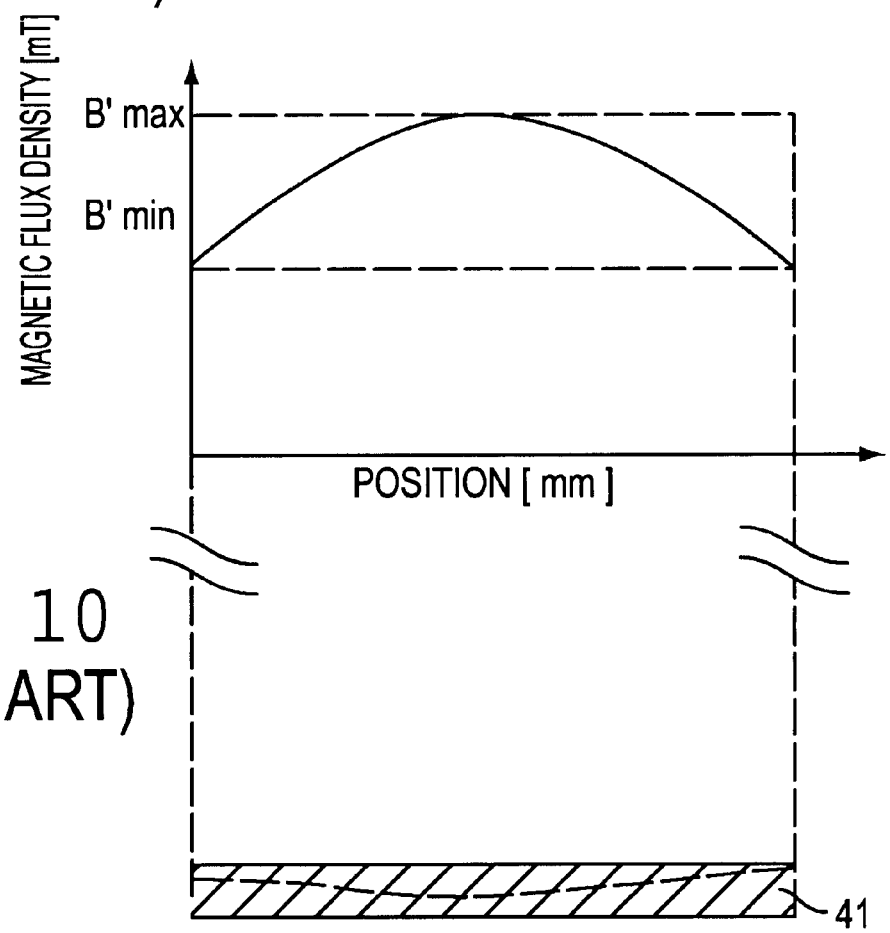
FIG. 9 is a graph representative of the magnetic field distribution of the magnetic field in the conventional apparatus.
FIG. 10 is a side view of the target with its position corresponding to FIG. 9.

In the arrangement with G (distance between the opposed groups of the magnets 12a, 12b): 190 mm, L (length of the magnets 12): 50 mm, H (distance between the opposed magnets 12A, 12B): 100 mm, and T (distance between the opposed magnets 12C, 12D): 136 mm, the iron(Fe)-neodymium(Nd)-boron(B) magnets were employed. The magnetic field distribution measured in the interface between both groups of the magnets 12a, 12b of the magnetic field H is shown in FIG. 7. As is apparent from this Figure, the magnetic field H has a caldera-like magnetic field distribution with the peripheral region having a high magnetic flux density and the center region having a low magnetic flux density.

Under the above condition, a silicon target having a size or 100 mm×160 mm was sputtered at $10^{-2}$ Pa seconds, which pressure was caused at the time of introduction of argon gas at a rate of 30 to 80 sccm, by using as a main discharging pump a vacuum unit having a discharging rate of at least 1000 l/sec. As a result, the target was eroded into a concave shape with a peripheral portion slightly thinner than a center portion.

The film forming operation was successfully continued for about three hours without the occurrence of the abnormal arc discharge, with the result that a silicon oxide film having a film thickness of about 30 $\mu$m was deposited on the surface of the substrate. In addition, the electric discharge at $10^{-2}$ Pa seconds caused the increase in density of the silicon oxide, which enabled an improved density.

It is to be noted that the present invention is not limited to the above arrangement or embodiment. Specifically, the formed film is not limited to the silicon oxide film. For example, a ZnO film used for a SAW filter, a composite oxide (STO, BTO) film used for a memory, a piezometric device or the like, a ceramic film used for a micromachine, light shielding for energy saving and antibacterial treatment applied to living and building construction, and any other known thin films can be an object to be formed on the substrate.

As described above, according to the mirrortron sputtering apparatus of the present invention, the magnetic field H formed by the groups of the magnets 12a, 12b has a magnetic field distribution with the peripheral region having a high magnetic flux density and the center region having a low magnetic flux density, so that the targets each are eroded into a concave shape with a peripheral portion slightly thinner than a center portion. This erosion can increase the total erosion amount per one target, and hence decrease the number of times that the targets are replaced with new ones, thereby enabling the film forming process to be automatically performed. As a result, the mirrortron sputtering apparatus of the present invention has the superior effect of not only achieving an improved time efficiency in film-forming process, but also reducing costs involved in film-forming process.

As an additional advantage, the magnetic field distribution formed by the present invention can suitably confine a plasma in the magnetic field, while preventing the intrusion of the reactive gas into the magnetic field. Accordingly, the abnormal arc discharge is unlikely to occur, and therefore the stabilized sputtering can be performed for a prolonged period of time. As a result, the mirrortron sputtering apparatus of the present invention has an additional superior effect of not only smoothly performing the film-forming process, but also obtaining the thin film having a predetermined thickness.

This specification is by no means intended to restrict the present invention to the preferred embodiments set forth therein. Various modifications to the mirrortron sputtering apparatus, as described herein, may be made by those skilled in the art without departing from the spirit and scope of the present invention as defined in the appended claims.

What is claimed is:

1. A mirrortron sputtering apparatus, for sputtering on a substrate comprising:

a vacuum chamber for placing therein a pair of targets spaced apart from each other with inner surfaces thereof facing each other and outer surfaces thereof positioned opposite to the inner surfaces:

first and second groups of rare earth magnets respectively disposed closer to the outer surfaces of the targets for forming a magnetic field between said pair of targets, in which each of said first and second groups of rare earth magnets respectively comprises four rare earth magnets which are arranged in a rectangular shape with a first pair of opposed magnets and a second pair of opposed magnets, thereby forming a rectangular-column shape:

said magnetic field having a magnetic field distribution with a peripheral region having a higher magnetic flux density than a magnetic flux density of a center region between one of the pair of targets and an interface of the pair of targets and between another of the pair of targets and said interface wherein when viewed in a three dimensional manner said peripheral region having the higher magnetic flux density than the magnetic flux density of said center region exists in a ring shape while said center region exists within said peripheral region to be surrounded by the same; and wherein said substrate is set alongside a space between the pair of targets as facing said magnetic field.

2. A mirrortron sputtering apparatus according to claim 1, further comprising:

shield covers for respectively covering said pair of targets; and said shield covers each having a peripheral edge forming an opening and extending around said peripheral region of the magnetic field.

3. A mirrortron sputtering apparatus according to claim 2, wherein said shield covers act as an earth electrical potential.

4. A mirrortron sputtering apparatus according to claim 1, wherein:

said peripheral region of the magnetic field has a magnetic flux density of 8 mT to 50 mT at positions intersecting said interface between said pair of targets; and said center region of the magnetic field has a magnetic flux density of 0 mT to 8 mT at a position intersecting said interface between said pair of targets.

5. A mirrortron sputtering apparatus according to claim 1 wherein:

said peripheral region of the magnetic field has a magnetic flux density of 8 mT to 50 mT at positions intersecting said interface between said pair of targets; and said center region of the magnetic field has a magnetic flux density of 0 mT to 8 mT at a position intersecting said interface between said pair of targets.

6. A mirrortron sputtering apparatus according to claim 1, further comprising:

a plate-shaped partition wall disposed on a lateral side of the pair of targets, said partition wall defining therein an opening open to the space between the pair of targets, gas supplying means of supplying a reactive gas into the space between the pair of targets, said gas supplying means being disposed closer to an edge of the partition wall defining said opening; and wherein a substrate is positioned on the outside of the partition wall with a surface of said substrate facing the space between the pair of targets.

7. A mirrortron sputtering apparatus according to claim 6, wherein a DC voltage or high-frequency voltage is applied to said gas supplying means.

8. A mirrortron sputtering apparatus according to claim 6, wherein a DC voltage or high-frequency voltage is applied to said substrate.

9. A mirrortron sputtering apparatus according to claim 6, wherein a bias voltage is applied to said substrate.

10. A mirrortron sputtering apparatus according to claim 1 wherein said first and second groups of rare earth magnets are made of neodymium magnets.

11. A mirrortron sputtering apparatus according to claim 1 wherein said first and second groups of rare earth magnets respectively have ends facing away from each other, said ends being respectively joined to rectangular block shaped yokes formed of a magnetic substance.

12. A mirrortron sputtering apparatus according to claim 1, wherein the first pair of opposed magnets has a length longer than that of the second pair of opposed magnets so as to enable said four of the rare earth magnets in each of the first and second groups of rare earth magnets to form an oblong rectangle.

13. A mirrortron sputtering apparatus according to claim 12, wherein a distance between the first pair of opposed magnets is set in the range of 70 to 150 mm.

14. A mirrortron sputtering apparatus according to claim 13, wherein a, distance between said first and second groups of rare earth magnets disposed with said magnetic filed therebetween is set in the range of 150 to 220 mm.

15. A mirrortron sputtering apparatus for sputtering on a substrate comprising:
 a vacuum chamber for placing therein a pair of targets:
  a pair of target holders disposed opposite to each other with a space therebetween for respectively holding said pair of targets in position with inner surfaces of the targets facing each other and outer surfaces thereof positioned opposite to the inner surfaces;
  first and second groups of rare earth magnets respectively mourned closer to the outer surfaces of the targets on said pair of target holders for forming a magnetic field between said targets, in which each of said first and second groups of rare earth magnets respectively comprises four rare earth magnets which are arranged in a rectangular shape with a first pair of opposed magnets and a second pair of opposed magnets thereby forming rectangular-column shape;
  said magnetic field having a magnetic field distribution with a peripheral region having magnetic flux density than a magnetic flux density of a center region between one of the pair of targets and said interface wherein when viewed in a three dimensional manner said peripheral region having the higher magnetic flux density than the magnetic flux density of said center region exists in a ring shape while said center region exists within said peripheral region to be surrounded by the same; and
  wherein said substrate is set alongside a space between the pair of targets as facing said magnetic field.

16. A mirrortron sputtering apparatus according to claim 15, further comprising:
 shield covers respectively mounted on inner sides of said pair of target holders via end edges thereof facing each other for respectively covering said pair of targets; and
 said shield covers each having a peripheral edge forming an opening and extending around said peripheral region of the magnetic field.

17. A mirrortron sputtering apparatus according to claim 16, wherein said shield covers act as an earth electrical potential.

18. A mirrortron sputtering apparatus according to claim 15 further comprising:
 a plate-shaped partition wall disposed on lateral side of the pair of targets, said partition wall defining therein an opening open to the space between the pair of targets,
 gas supplying means of supplying a reactive gas into the space between the pair of targets, said gas supplying means being disposed closer to an edge of the partition wall defining said opening; and wherein
 a substrate is positioned on the outside of the partition wall with a surface of said substrate facing the space between the pair of targets.

19. A mirrortron sputtering apparatus according to claim 18, wherein a DC voltage or high-frequency voltage is applied to said gas supplying means.

20. A mirrortron sputtering apparatus according to claim 18, wherein a DC voltage or high-frequency voltage is applied to said substrate.

21. A mirrortron sputtering apparatus according to claim 18, wherein a bias voltage is applied to said substrate.

22. A mirrortron sputtering apparatus according to claim 15, wherein said first and second groups of rare earth magnets are made of neodymium magnets.

23. A mirrortron sputtering apparatus according to claim 15, wherein said first and second groups of rare earth magnets respectively have ends facing away from each other, said ends being respectively joined to rectangular block shaped yokes formed of a magnetic substance.

24. A mirrortron sputtering apparatus according to claim 15, wherein the first pair of opposed magnets has a length longer than that of the second pair of opposed magnets so as to enable said four of the rare earth magnets in each of the first and second groups of rare earth magnets to form an oblong rectangle.

25. A mirrortron sputtering apparatus according to claim 24, wherein a distance between the first pair of opposed magnets is set in the range of 70 to 150 mm.

26. A mirrortron sputtering apparatus according to claim 25, wherein a distance between said first and second groups of rare earth magnets disposed with said magnetic filed therebetween is set in the range of 150 to 220 mm.

* * * * *